(12) United States Patent
Liu et al.

(10) Patent No.: US 9,671,086 B2
(45) Date of Patent: Jun. 6, 2017

(54) OXYNITRIDE ORANGE-RED FLUORESCENT SUBSTANCE AND LIGHT-EMITTING FILM OR SHEET AND LIGHT-EMITTING DEVICE COMPRISING THE SAME

(71) Applicant: GRIREM ADVANCED MATERIALS CO., LTD., Beijing (CN)

(72) Inventors: Ronghui Liu, Beijing (CN); Yuanhong Liu, Beijing (CN); Huaqiang He, Beijing (CN); Xiaowei Huang, Beijing (CN); Wei Gao, Beijing (CN); Tao He, Beijing (CN); Yunsheng Hu, Beijing (CN); Weidong Zhuang, Beijing (CN)

(73) Assignee: GRIREM ADVANCED MATERIALS CO., LTD., Beijing (CN)

( * ) Notice: Subject to any disclaimer, the term of this patent is extended or adjusted under 35 U.S.C. 154(b) by 56 days.

(21) Appl. No.: 14/443,053

(22) PCT Filed: Dec. 20, 2013

(86) PCT No.: PCT/CN2013/090145
§ 371 (c)(1),
(2) Date: May 14, 2015

(87) PCT Pub. No.: WO2014/094657
PCT Pub. Date: Jun. 26, 2014

(65) Prior Publication Data
US 2015/0308657 A1    Oct. 29, 2015

(30) Foreign Application Priority Data

Dec. 21, 2012    (CN) .......................... 2012 1 0564599

(51) Int. Cl.
*C09K 11/00* (2006.01)
*F21V 9/16* (2006.01)
*C09K 11/08* (2006.01)
*C09K 11/77* (2006.01)
(Continued)

(52) U.S. Cl.
CPC ............ *F21V 9/16* (2013.01); *C09K 11/0883* (2013.01); *C09K 11/7734* (2013.01);
(Continued)

(58) Field of Classification Search
CPC ............ C09K 11/0883; C09K 11/7734; C09K 11/7792; F21V 9/16; H01L 33/502; H05B 33/14; Y02B 20/181; F21K 9/64
See application file for complete search history.

(56) References Cited

U.S. PATENT DOCUMENTS

2008/0303409 A1    12/2008    Hirosaki
2009/0033201 A1*   2/2009    Shimooka .......... C09K 11/0883
                                                          313/483
(Continued)

FOREIGN PATENT DOCUMENTS

CN    1977030 A    6/2007
CN    102443391 A    5/2012
(Continued)

OTHER PUBLICATIONS

CN 102464979-5-23-20125, English Translation.*
(Continued)

*Primary Examiner* — Peggy Neils
(74) *Attorney, Agent, or Firm* — Knobbe, Martens, Olson & Bear, LLP

(57) ABSTRACT

An oxynitride orange-red fluorescent substance and a light-emitting film or sheet and a light-emitting device comprising the same are disclosed. The chemical formula of the oxynitride orange-red fluorescent substance is $M_m A_a Si_x N_y O_z$:dR in which the element M is one or more of the elements selected from Ca, Sr and Ba, the element A is Al or a mixture (Continued)

of Al with one or more of the elements selected from Ga, La, Sc and Y, the element R is one or more of the elements selected from Ce, Eu and Mn, $0.8 \leq m \leq 1.2$, $1 < a < 1.7$, $1 < x < 1.7$, $3 < y < 4.2$, $0 < z < 0.7$, and $0.001 \leq d \leq 0.2$.

16 Claims, 2 Drawing Sheets

(51) Int. Cl.
    *H05B 33/14*      (2006.01)
    *F21K 9/64*      (2016.01)
    *H01L 33/50*      (2010.01)
    *F21Y 115/10*      (2016.01)

(52) U.S. Cl.
    CPC ............ *C09K 11/7792* (2013.01); *F21K 9/64* (2016.08); *H05B 33/14* (2013.01); *F21Y 2115/10* (2016.08); *H01L 33/502* (2013.01); *Y02B 20/181* (2013.01)

(56) References Cited

U.S. PATENT DOCUMENTS

2011/0309399 A1* 12/2011 Shinohara .......... C09K 11/0883
                                                                                          257/98

2012/0080704 A1    4/2012   Juang et al.
2013/0207538 A1*   8/2013   Hirosaki ............ C09K 11/0883
                                                                                         313/504

FOREIGN PATENT DOCUMENTS

| CN | 102453485 A | 5/2012 |
|---|---|---|
| CN | 102464979 A | 5/2012 |
| CN | 102994079 A | 3/2013 |
| KR | 10-2008-001505 | 2/2008 |

OTHER PUBLICATIONS

International Search Report for PCT/CN2013/090145 dated Apr. 3, 2014 in 3 pages.
Chinese Office Action for Application No. 201210564599.2 dated Jun. 6, 2014 in 6 pages.
Extended European Search Report for Application No. 13864267.3 dated Jul. 4, 2016 in 5 pages.
Korean Office Action for Application No. 10-2015-7011284 dated Sep. 9, 2016 in 6 pages.

* cited by examiner

OXYNITRIDE ORANGE-RED FLUORESCENT SUBSTANCE AND LIGHT-EMITTING FILM OR SHEET AND LIGHT-EMITTING DEVICE COMPRISING THE SAME

TECHNICAL FIELD

The present disclosure relates to the technical field of semiconductors, and particularly relates to an oxynitride orange-red fluorescent substance and a light-emitting film or sheet and a light-emitting device comprising the same.

BACKGROUND

With advantages of low voltage, high luminous efficiency, low energy consumption, long service life and no pollution, white light-emitting diode (white LED) has been successfully used in the semiconductor lighting field and the flat panel display field. Current white LED is mainly realized in the following two ways: way 1, a white LED is formed by combining LED chips of thee primary colors (red, blue, green); way 2, fluorescent substances are excited by LED chips to emit lights, and the lights emitted from the fluorescent substances are mixed together with the lights from the LED chips, then form white light, that is, a blue LED chip is cooperated with a fluorescent substance emitting yellow light, or a blue LED chip is cooperated with a fluorescent substance emitting green light and a fluorescent substance emitting red light, or an ultraviolet or a purple LED chip is used to excite a red fluorescent substance, a green fluorescent substance and a blue fluorescent substance. In these realization ways, the forming of a white LED through the cooperation of a blue LED chip with a yellow fluorescent substance $Y_3Al_5O_{12}$:Ce is simple, practical and relatively cheap and therefore becomes the mainstream. However, the spectrum of the white light formed in this way is relatively monotonous, mainly concentrated in the yellow area, which leads to the relatively low color rendering property in the white LED preparation. The red color component absent in the spectrum of such a white LED can be compensated by adding an orange-red fluorescent substance during the package process, thereby promoting the color rendering capability of the white LED product.

Nitride/oxynitride fluorescent substance has gained wide attention since its advent. The anion group of such fluorescent substance contains $N^{3-}$ which carries high negative charge, the excitation spectrum of such fluorescent substance moves towards the direction of a long wave (near-ultraviolet light, visible light) under the expansion effect of electronic cloud so that such fluorescent substance emits light under the excitation of blue light and ultraviolet light the wavelength of which is within a range of 200-500 nm, and the dominant wavelength of the emitted light is distributed in a relatively wide range of 600-720 nm. Thus, such fluorescent substance has characteristics of excellent color rendering performance, high luminous efficiency, high safety, no toxicity and environmental friendliness, moreover, as the substrate of such fluorescent substance has a tight network structure, the physical and the chemical properties of such fluorescent substance are stable (e.g. the fluorescent substances disclosed in EP1104799A1, WO2005/052087, CN100340631C, CN101090953A). In silicon-based nitride red fluorescent substance (patent No. CN1918262B), the luminous intensity of a fluorescent substance can be effectively improved through the adjustment and control of Sr on $CaAlSiN_3$:Eu red fluorescent substance. The oxynitride orange-red fluorescent substance provided herein enables fluorescent substance to be regulated and controlled in a wider range, extending the photochromic range of fluorescent substance to an orange area.

SUMMARY

To address the defects in the prior art, the present disclosure provides an oxynitride orange-red fluorescent substance and a light-emitting film or sheet and a light-emitting device comprising the same to improve the luminous efficiency of the oxynitride orange-red fluorescent substance.

According to an aspect of the present invention, an oxynitride orange-red fluorescent substance is provided, with the chemical formula of $M_mA_aSi_xN_yO_z$:dR wherein the element M is one or more of the elements selected from Ca, Sr and Ba, the element A is Al or a mixture of Al with one or more of the elements selected from Ga, La, Sc and Y, the element R is one or more of the elements selected from Ce, Eu and Mn, and above chemical formula meets $0.85 \leq m \leq 51.2$, $1 < a < 1.7$, $1 < x < 1.7$, $3 < y < 4.2$, $0 < z < 0.7$, and $0.001 \leq d \leq 0.2$.

Further, in the chemical formula of the foregoing fluorescent substance, a:x=0.8-1.2.

Further, in the chemical formula of the foregoing fluorescent substance, a/(m+d)>1.

Further, in the powder X-ray diffraction spectrum in which Cukα rays are used, the main generation phase of the oxynitride orange-red fluorescent substance at least has a diffraction peak in Bragg angle (2θ) ranges of 31.3-32.7 degrees, 35.2-36.2 degrees, 36.2-36.7 degrees and 36.7-37.6 degrees, wherein a intensity of the diffraction peak in the range of 36.7-37.6 degrees is not lower than 18% of the intensity of the diffraction peak in the range of 36.2-36.7 degrees, and a full width at half maximum (FWHM) of the emission spectrum of the fluorescent substance is not below 82 nm.

Further, in the powder X-ray diffraction spectrum in which Cukα rays are used, the main generation phase of the oxynitride orange-red fluorescent substance at least has a diffraction peak in Bragg angle (2θ) ranges of 31.3-31.8 degrees, 31.8-32.7 degrees, 35.2-36.2 degrees, 36.2-36.7 degrees, 36.7-37.6 degrees, 48.0-49.5 degrees and 56.0-57.2 degrees, and the full width at half maximum (FWHM) of the emission spectrum of the fluorescent substance is not below 95 nm. Further, the foregoing element M is Ca and/or Sr, the element A is Al or the mixture of Al with Ga and/or Y, and the element R is one or more of the elements Eu and Mn.

Further, the foregoing element A is Al.

Further, the foregoing element R is Eu.

Further, the foregoing element M is Ca.

Further, the foregoing fluorescent substance is powder-shaped, film-shaped or sheet-shaped.

A light-emitting film or sheet is also provided in the present invention which is formed by dispersing the foregoing oxynitride orange-red fluorescent substance in a glass material, a plastic material or a resin material, or the light-emitting film or sheet is formed by dispersing the foregoing oxynitride orange-red fluorescent substance and other fluorescent substances in a glass material, a plastic material or a resin material or by coating the foregoing oxynitride orange-red fluorescent substance and other fluorescent substances on a glass material, a plastic material or a resin material.

Further, in the light-emitting film or sheet, the other fluorescent substances refer to one or more of the following fluorescent substances: $(Y,Gd,Lu,Tb)_3(Al,Ga)_5O_{12}$:Ce, (Mg, $(Ca,Sr,Ba)_2SiO_4$:Eu, $(Ca,Sr)_3SiO_5$:Eu, $(La,Ca)_3Si_6N_{11}$:Ce, a-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Sr,Ca)AlSiN_3$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$: Eu and $3.5MgO \cdot 0.5MgF_2 \cdot GeO_2$:Mn.

Meanwhile, a light-emitting device is also provided in the present disclosure which at least comprises a radiation source and the foregoing oxynitride orange-red fluorescent substance.

Further, the foregoing radiation source is an ultraviolet light emitting source, a purple light emitting source or a blue light emitting source.

Further, the foregoing light-emitting device also comprises other fluorescent substances which emit light under the excitation of a radiation source.

Further, the other fluorescent substances refer to one or more of the following fluorescent substances: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, a-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Sr,Ca)AlSiN_3$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu and $3.5MgO \cdot 0.5MgF_2 \cdot GeO_2$:Mn.

The oxynitride orange-red fluorescent substance provided herein can emit orange-red light under the excitation of a radiation source, and with a relatively high luminous efficiency, the oxynitride orange-red fluorescent substance meets the demands for high color rendering performance and low color temperature of a white LED.

The present disclosure has other objects, features and advantages apart from those described above. The present disclosure is described below in detail with reference to accompanying drawings.

BRIEF DESCRIPTION OF THE DRAWINGS

The accompanying drawings, which constitute a part of the specification, illustrate preferred embodiment of the present disclosure, and together with the description, serve to explain the principles of the present disclosure. In the accompanying drawings.

DETAILED DESCRIPTION OF THE EMBODIMENTS

Figure 1:
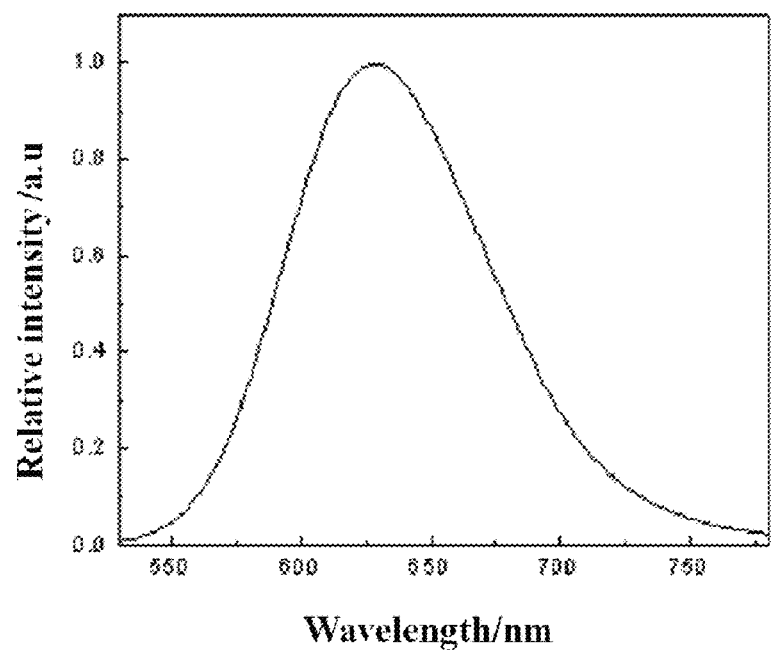
FIG. 1 shows the emission spectrum of a fluorescent substance prepared in embodiment 1 of the present disclosure.

It should be noted that the following detailed description is illustrative and intended to provide a thorough understanding of the present disclosure and that the technology and the scientific terms used herein have the same meaning as commonly understood by one of ordinary skill in the art.

In an embodiment of the present invention, an oxynitride orange-red fluorescent substance is provided. The chemical formula of the fluorescent substance is $M_mA_aSi_xN_yO_z$:dR, wherein the element M is one or more of the elements selected from Ca, Sr and Ba, the element A is Al or a mixture of Al with one or more of the elements selected from Ga, La, Sc and Y, the element R is one or more of the elements selected from Ce, Eu and Mn, and foregoing chemical formula meets m≤1.2, 1<a<1.7, 1<x<1.7, 3<y<4.2, 0<z<0.7, and 0.001≤d≤0.2. Preferably, in the chemical formula of the fluorescent substance, a:x=0.8-1.2.

The oxynitride orange-red fluorescent substance provided herein can emit orange-red light under the excitation of a radiation source, and with a relatively high luminous efficiency, the oxynitride orange-red fluorescent substance meets the demands for high color rendering performance and low color temperature of a white LED. A fluorescent substance having the foregoing chemical formula in which the ratio of a to x is 0.8-1.2 is preferred as such fluorescent substance has a high content of main generation phase and a low content of impurity phase and therefore has an excellent luminescence property.

Preferably, in the chemical formula of the foregoing fluorescent substance, it is defined for the a, m and d as a/(m+d)>1 so as to limit the relationship among the atom numbers of the elements M, A and R to widen the full width at half maximum (FWHM) of fluorescent substance of this series. Thus, fluorescent substance of this series has a relatively high luminance. As white LED device with high color rendering performance requires the spectrum of white light to be distributed as widely as possible in a visible light range, the fluorescent substance represented by this scheme has a great advantage in preparing a white LED with high color rendering performance and high luminous efficiency.

In a preferred embodiment of the present invention, in the powder X-ray diffraction spectrum in which Cukα rays are used, the main generation phase of the foregoing oxynitride orange-red fluorescent substance at least has a diffraction peak in Bragg angle (2θ) ranges of 31.3-32.7 degrees, 35.2-36.2 degrees, 36.2-36.7 degrees and 36.7-37.6 degrees, wherein the intensity of the diffraction peak in the range of 36.7-37.6 degrees is not lower than 18% of the intensity of the diffraction peak in the range of 36.2-36.7 degrees, and a full width at half maximum (FWHM) of the emission spectrum of the fluorescent substance is not below 82 nm. Structurally controlled in the foregoing range, the oxynitride orange-red fluorescent substance has the advantages of wide full width at half maximum (FWHM) and high luminous efficiency and is therefore beneficial to the production of a white LED device with high color rendering performance and high luminous efficiency.

Preferably, in the powder X-ray diffraction spectrum in which Cukα rays are used, the main generation phase of the foregoing oxynitride orange-red fluorescent substance at least has a diffraction peak in Bragg angle (2θ) ranges of 31.3-31.8 degrees, 31.8-32.7 degrees, 35.2-36.2 degrees, 36.2-36.7 degrees, 36.7-37.6 degrees, 48.0-49.5 degrees and 56.0-57.2 degrees, and the full width at half maximum (FWHM) of the emission spectrum of the fluorescent substance is not below 95 nm.

Preferably, in the molecular formula of the foregoing oxynitride orange-red fluorescent substance, the element M is Ca and/or Sr, the element A is Al or the mixture of Al with Ga and/or Y, and the element R is Eu and/or Mn; more preferably, in the molecular formula of the foregoing oxynitride orange-red fluorescent substance, the element M is Ca and/or Sr, the element A is Al, and the element R is Eu and/or Mn; still more preferably, in the molecular formula of the foregoing oxynitride orange-red fluorescent substance, the element M is Ca and/or Sr, the element A is Al, and the element R is Eu; yet more preferably, in the molecular formula of the foregoing oxynitride orange-red fluorescent substance, the element M is Ca, the element A is Al, and the element R is Eu; and yet still more preferably, the foregoing oxynitride orange-red fluorescent substance is powder-shaped, film-shaped or sheet-shaped.

Preferably, the molecular formula of the oxynitride orange-red fluorescent substance is $Ca_mAl_aSi_xN_yO_z$:dEu, wherein $0.8 \leq m \leq 1$, $1 < a < 1.7$, $1 < x < 1.7$, $3 < y < 4.2$, $0.1 < z < 0.7$, and $0.001 \leq d \leq 0.2$. A fluorescent substance having the foregoing molecular formula contains few raw material components, has excellent performance and is easy to process.

Meanwhile, a light-emitting film or sheet is also provided in the present disclosure which is formed by dispersing the foregoing oxynitride orange-red fluorescent substance in a glass material, a plastic material or a resin material or by dispersing the foregoing oxynitride orange-red fluorescent substance and other fluorescent substances in a glass material, a plastic material or a resin material or by coating the foregoing oxynitride orange-red fluorescent substance and other fluorescent substances on a glass material, a plastic material or a resin material. The light-emitting film or sheet can emit an orange-red light, and the fluorescent substance has relatively high luminous efficiency. The light-emitting film or sheet provided herein can meet the demands for high color rendering performance and low color temperature of a white LED.

Further, in the light-emitting film or sheet, the other fluorescent substances refer to one or more of the following fluorescent substances: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, a-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Sr,Ca)AlSiN_3$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$: Eu and $3.5MgO.0.5MgF_2.GeO_2$:Mn.

Besides, a light-emitting device is also provided in the present disclosure which at least comprises a radiation source and the foregoing oxynitride orange-red fluorescent substance. Preferably, the radiation source is an ultraviolet light emitting source, a purple light emitting source or a blue light emitting source.

Preferably, the light-emitting device also comprises other fluorescent substances which emit light under the excitation of a radiation source. The other fluorescent substances refer to one or more of the following fluorescent substances: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, a-SiAlON:Eu, β-SiAlON:Eu, $Ba_3Si_6O_{12}N_2$:Eu, $Ca_3(Sc,Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Sr,Ca)AlSiN_3$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, $(Sr,Ca)S$:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu and $3.5MgO.0.5MgF_2.GeO_2$:Mn.

It can be seen from the above technical schemes that the series of new orange-red fluorescent substances, with the chemical formula of which is $M_mA_aSi_xN_yO_z$:dR can emit orange-red light under the excitation of an external radiation resource to meet the demands for high color rendering performance and low color temperature of a white LED.

Although not limited to be synthesized with specified raw materials or prepared using a specific method, the fluorescent substance involved in the present disclosure is preferably prepared with the following raw materials and using the following preparation method so as to be improved in photochromic property. Preferably, the raw materials for synthesizing the fluorescent substance are nitrides of various metals and non-metallic element. The raw materials are weighted in a needed proportion and then fully and uniformly mixed. The mixture is calcined in a calcination environment which is selected to be in a high-pressure/normal-pressure furnace, and the atmosphere of the calcination is nitrogen, nitrogenhydrogen mixture or CO to prevent the oxygen in the air from entering the furnace. In the calcination, the raw materials are usually preserved at a highest preservation temperature for 20 minutes to 20 hours. If the preservation time is too short, the reaction of raw materials cannot be sufficient, and if the preservation time is too long, the element N will overflow and fluorescent crystals will grow abnormally. For this reason, it is preferred that the preservation time is 3-8 hours. Then, the temperature in the furnace is reduced to below 100 degrees centigrade, and the obtained powder is taken out and subjected to post-treatments including grinding, acid washing, screening and drying.

Not limited to be prepared with specified raw materials or using a specified method, the fluorescent film or sheet involved in the present disclosure can be prepared as long as using the following method: the red fluorescent substance disclosed herein or the mixture of the fluorescent substance disclosed herein and other fluorescent substances are uniformly mixed with raw materials of a glass material, a plastic material, a ceramic material or a resin material in the amount or amounts equal to that or those of the fluorescent substances contained in a conventional fluorescent film or sheet. Then, the mixture is prepared into a film or sheet using the conventional preparation method of glass material, plastic material, ceramic material or resin material. The light-emitting film or sheet provided herein can be prepared by those skilled in the art using a rational technical means, thus, the preparation method of the light-emitting film or sheet provided herein is not described here repeatedly.

The fluorescent substance involved herein can be efficiently excited by a radiation light with the wavelength of 300-500 nm. A light-emitting device can be formed by combing the fluorescent substance involved herein or a light conversion film material, such as resin, silica gel, plastic, glass and ceramic, doped with the fluorescent substance involved herein with an ultraviolet light radiation source, a purple light radiation source or a blue light radiation source. Such white light-emitting devices can be widely used in illumination or display fields.

The advantages of the orange-red fluorescent substance prepared in the present disclosure are further described below with reference to specific embodiments.

Embodiments 1-26 and Comparative Embodiment 1(D1)

Raw materials: a silicon source of silicon nitride and/or silicon oxide, an aluminum source of any one or more of aluminum nitride, aluminum nitrate and metallic aluminum (the same to Ga, La, Sc and Y), a calcium source of any one or more of calcium nitride, calcium oxide, calcium carbonate and calcium hydroxide (the same to Sr and Ba), and an europium source of europium nitride and/or europium oxide (the same to Ce, Mn).

Preparation method: the raw materials are weighed according to the proportion of the raw materials in a chemical formula to be formed, the weighed raw materials are uniformly mixed and preserved at 1500 degrees centigrade for 3 hours in the atmosphere of nitrogenhydrogen mixture, then the temperature is decreased to below 100 degrees centigrade, the calcined product is taken out and subjected to post-treatments including grinding, acid washing, drying and screening to obtain a fluorescent substance.

Test 1: the fluorescent substance of embodiments 1-26 and comparative embodiment (D1) is excited using blue light with the wavelength of 460 nm, and the chromaticity coordinate, the emission spectrum, the full width at half maximum (FWHM) and the relative luminance of the fluorescent substance are tested.

Result of Test:

(1) FIG. 1 shows the emission spectrum of the fluorescent substance prepared in embodiment 1, and as shown in FIG. 1, the fluorescent substance has a relatively wide emission peak within a wavelength range of 550-750 nm, and the fluorescent substance emits red light;

(2) the result of the test on the chromaticity coordinates, the peak width at half height and the relative luminance of the fluorescent substance of each of embodiments 1-26 and comparative embodiment (D1) are shown in the following Table 1.

It can be seen from Table 1 that the oxynitride orange-red fluorescent substance provided herein has the advantages of wide FWHM and high luminous efficiency. It is beneficial to the production of a white LED device with high color rendering performance and high luminous efficiency. The fluorescent substance with the chemical formula of $M_m A_a Si_x N_y O_z$:dR in which $0.8 \leq m \leq 1.2$, $1 < a < 1.7$, $1 < x < 1.7$, $3 < y < 4.2$, $0 < z < 0.7$, and $0.001 \leq d \leq 0.2$ is obviously superior in relative luminance to the fluorescent substance (D1) not meeting the foregoing numerical range condition. The fluorescent substance having the foregoing chemical formula in which $a:x=0.8-1.2$ is obviously superior in relative luminance to the fluorescent substance not meeting the condition that $a:x=0.8-1.2$ (embodiments 1).

Test 2

While the chemical formula of the oxynitride orange-red fluorescent substance provided herein is $M_m A_a Si_x N_y O_z$:dR, it is preferred that in the powder X-ray diffraction spectrum in which Cukα rays are used, the main generation phase of the powder at least has a diffraction peak in Bragg angle (2θ) ranges of 31.3-32.7 degrees, 35.2-36.2 degrees, 36.2-36.7 degrees and 36.7-37.6 degrees, wherein the intensity of the diffraction peak in the range of 36.7-37.6 degrees is not lower than 18% of that of the diffraction peak in the range of 36.2-36.7 degrees, and the full width at half maximum (FWHM) of the emission spectrum of the fluorescent substance is not below 82 nm.

To clarify the relationship between the structure and the luminous efficiency of the oxynitride orange-red fluorescent substance provided herein, X-ray diffraction spectrums of the oxynitride orange-red fluorescent substances of the foregoing embodiments 2 and 5 are provided. Moreover, the intensity of the diffraction peaks in the X-ray diffraction spectrums of the oxynitride orange-red fluorescent substance of embodiments 1-26 and the comparative embodiment 1 are further provided.

TABLE 1

| | Chemical formula | Chromaticity coordinates X | Chromaticity coordinates Y | FWMH (nm) | Relative luminance (%) |
|---|---|---|---|---|---|
| 1 | $Ca_{0.99}Al_1Si_{1.3}N_{3.37}O_{0.05}$: 0.01Eu | 0.6800 | 0.3076 | 79.0 | 95% |
| 2 | $Ca_{0.99}Al_{1.11}Si_{1.11}N_{3.19}O_{0.11}$: 0.01Eu | 0.6606 | 0.3388 | 82.5 | 100% |
| 3 | $Ca_{0.79}Al_{1.18}Si_{1.18}N_{3.16}O_{0.18}$: 0.01Eu | 0.6356 | 0.3578 | 95.4 | 113% |
| 4 | $Ca_{0.99}Al_{1.25}Si_{1.25}N_{3.42}O_{0.25}$: 0.01Eu | 0.6185 | 0.3792 | 99.8 | 127% |
| 5 | $Ca_{0.99}Al_{1.33}Si_{1.33}N_{3.56}O_{0.33}$: 0.01Eu | 0.5903 | 0.3841 | 114.9 | 138% |
| 6 | $Ca_{0.99}Al_{1.43}Si_{1.43}N_{3.71}O_{0.43}$: 0.01Eu | 0.5758 | 0.4187 | 124.5 | 153% |
| 7 | $Ca_{0.99}Al_{1.54}Si_{1.54}N_{3.90}O_{0.54}$: 0.01Eu | 0.5603 | 0.4340 | 129.8 | 165% |
| 8 | $Ca_{0.99}Al_{1.67}Si_{1.67}N_{4.11}O_{0.67}$: 0.01Eu | 0.5486 | 0.4433 | 135.1 | 168% |
| 9 | $Ca_{0.999}Al_{1.67}Si_{1.67}N_{4.11}O_{0.67}$: 0.01Eu | 0.5262 | 0.5045 | 134 | 135% |
| 10 | $Ca_{0.995}Al_{1.67}Si_{1.67}N_{4.11}O_{0.67}$: 0.005Eu | 0.5383 | 0.4540 | 134.3 | 159% |
| 11 | $Ca_{0.9}Al_{1.67}Si_{1.67}N_{4.11}O_{0.67}$: 0.1Eu | 0.5977 | 0.3987 | 134.5 | 115% |
| 12 | $Ca_{1.0}Al_{1.67}Si_{1.67}N_{4.25}O_{0.67}$: 0.2Eu | 0.6045 | 0.3876 | 134.4 | 98% |
| 13 | $Sr_{0.1}Ca_{0.89}Al_{1.2}N_{3.17}O_{0.05}$: 0.01Eu | 0.6736 | 0.326 | 86.2 | 101% |
| 14 | $Sr_{0.3}Ca_{0.69}Al_{1.05}Si_{1.05}N_{3.09}O_{0.05}$: 0.01Eu | 0.6672 | 0.3325 | 88.1 | 111% |
| 15 | $Sr_{0.5}Ca_{0.49}Al_{1.05}Si_{1.05}N_{3.09}O_{0.05}$: 0.01Eu | 0.6565 | 0.3431 | 90.3 | 125% |
| 16 | $Sr_{0.8}Ca_{0.19}Al_{1.05}Si_{1.05}N_{3.09}O_{0.05}$: 0.01Eu | 0.6347 | 0.3647 | 90.5 | 153% |
| 17 | $Sr_{0.95}Ca_{0.04}Al_{1.05}Si_{1.05}N_{3.09}O_{0.05}$: 0.01Eu | 0.6226 | 0.3767 | 88.7 | 158% |
| 18 | $Ca_{0.79}Ba_{0.1}Al_{1.67}Si_{1.67}N_{4.11}O_{0.67}$: 0.01Eu | 0.5501 | 0.4324 | 136.0 | 155% |
| 19 | $Ca_{0.99}Al_{1.665}Ga_{0.005}Si_{1.67}N_{4.11}O_{0.67}$: 0.01Eu | 0.5489 | 0.4431 | 136.0 | 154% |
| 20 | $Ca_{0.99}Al_{1.67}La_{0.02}Si_{1.67}N_{4.11}O_{0.67}$: 0.01Eu | 0.5474 | 0.4445 | 133.0 | 160% |
| 21 | $Ca_{0.99}Al_{1.67}Sc_{0.02}Si_{1.67}N_{4.11}O_{0.67}$: 0.01Eu | 0.5481 | 0.4437 | 134.0 | 163% |
| 22 | $Ca_{0.99}Al_{1.67}Y_{0.02}Si_{1.67}N_{4.11}O_{0.67}$: 0.01Eu | 0.5470 | 0.4450 | 133.5 | 162% |
| 23 | $Ca_{0.79}Al_{1.67}Si_{1.67}N_{3.98}O_{0.67}$: 0.009Eu,0.001Mn | 0.5485 | 0.4434 | 135.1 | 163% |
| 24 | $Ca_{1.19}Al_{1.54}Si_{1.54}N_{3.94}O_{0.67}$: 0.009Eu,0.0005Ce,0.0005Mn | 0.5483 | 0.4437 | 129.0 | 164% |
| 25 | $Ca_{1.19}Al_{1.11}Si_{1.18}N_{3.12}O_{0.18}$: 0.01Eu | 0.6363 | 0.3571 | 95.1 | 107% |
| 26 | $Ca_{1.17}Al_{1.18}Si_{1.18}N_{3.42}O_{0.18}$: 0.01Eu | 0.6351 | 0.3585 | 95.2 | 113% |
| D1 | $Ca_{0.99}Al_{0.79}Si_1N_{2.76}O_{0.05}$: 0.01Eu | 0.6798 | 0.3079 | 79.0 | 93% |

Figure 2:
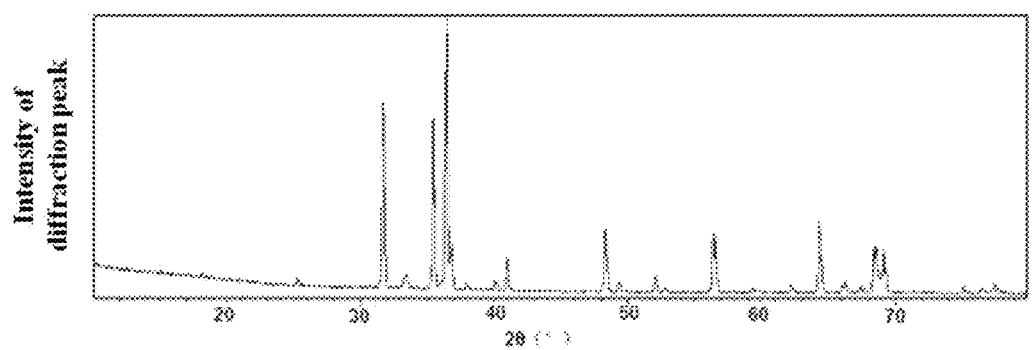
FIG. 2 shows the XRD spectrum of a fluorescent substance prepared in embodiment 2 of the present disclosure.
Figure 3:
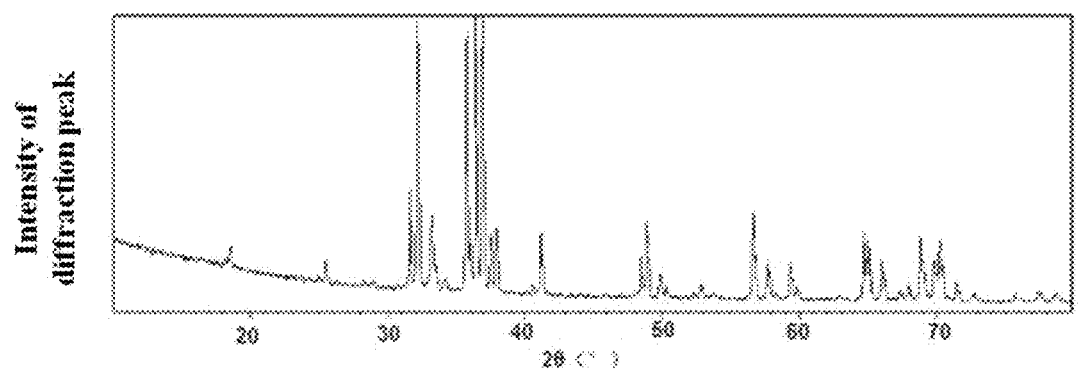
FIG. 3 shows the XRD spectrum of a fluorescent substance prepared in embodiment 5 of the present disclosure.

X-ray diffraction spectrums of the oxynitride orange-red fluorescent substances of the foregoing embodiments 2 and 5 are respectively shown in FIG. 2 and FIG. 3.

FIG. 2 shows the X-ray diffraction spectrum of the fluorescent substance prepared in embodiment 2, and as shown in FIG. 2, diffraction peaks exist in Bragg angle (2θ) ranges of 31.3-32.7 degrees, 35.2-36.2 degrees, 36.2-36.7 degrees, 36.7-37.6 degrees, 48.0-49.5 degrees, 56.0-57.2 degrees, and the intensity of the diffraction peak in the range (2θ) of 36.7-37.6 degrees is 18.8% of that of the diffraction peak in the range of 36.2-36.7 degrees.

FIG. 3 shows the X-ray diffraction spectrum of the fluorescent substance prepared in embodiment 5, and as shown in FIG. 3, diffraction peaks exist in Bragg angle (2θ) ranges of 31.3-31.8 degrees, 31.8-32.7 degrees, 35.2-36.2 degrees, 36.2-36.7 degrees, 36.7-37.6 degrees, 48.0-49.5 degrees, 56.0-57.2 degrees, and the intensity of the diffraction peak in the range (2θ) of 36.7-37.6 degrees is 100.4% of that of the diffraction peak in the range (2θ) of 36.2-36.7 degrees.

The intensity of the diffraction peaks in the X-ray diffraction spectrums of the oxynitride orange-red fluorescent substances of embodiments 1-26 and comparative embodiment 1 are shown in Table 2.

TABLE 2

Diffraction intensity (Counts) of diffraction peak in different diffraction angle ranges

| | 31.3-31.8 degrees | 31.8-32.7 degrees | 35.2-36.2 degrees | 36.2-36.7 degrees | 36.7-37.6 degrees | 48.0-49.5 degrees | 56.0-57.2 degrees |
|---|---|---|---|---|---|---|---|
| 1 | | 978 | 913 | 1328 | 182 | 411 | 431 |
| 2 | | 1075 | 788 | 1478 | 278 | 328 | 339 |
| 3 | 537 | 905 | 680 | 1293 | 475 | 284 | 289 |
| 4 | 420 | 450 | 802 | 836 | 923 | 239 | 240 |
| 5 | 343 | 825 | 734 | 786 | 789 | 223 | 224 |
| 6 | 267 | 801 | 580 | 653 | 637 | 206 | 238 |
| 7 | 235 | 903 | 734 | 723 | 667 | 211 | 208 |
| 8 | 201 | 1017 | 872 | 834 | 693 | 227 | 190 |
| 9 | 272 | 1369 | 1165 | 1121 | 938 | 295 | 236 |
| 10 | 223 | 1162 | 989 | 968 | 793 | 267 | 210 |
| 11 | 170 | 881 | 749 | 721 | 601 | 183 | 152 |
| 12 | 151 | 758 | 632 | 628 | 515 | 173 | 139 |
| 13 | | 970 | 715 | 1395 | 255 | 289 | 303 |
| 14 | | 879 | 642 | 1275 | 237 | 257 | 271 |
| 15 | 415 | 709 | 527 | 1123 | 372 | 213 | 238 |
| 16 | 381 | 629 | 472 | 967 | 325 | 207 | 215 |
| 17 | 352 | 590 | 439 | 912 | 317 | 179 | 198 |
| 18 | 212 | 1027 | 879 | 853 | 698 | 237 | 199 |
| 19 | 215 | 1024 | 882 | 847 | 701 | 243 | 201 |
| 20 | 196 | 987 | 835 | 826 | 679 | 214 | 185 |
| 21 | 198 | 991 | 847 | 837 | 680 | 217 | 193 |
| 22 | 192 | 985 | 841 | 824 | 674 | 226 | 183 |
| 23 | 173 | 905 | 768 | 745 | 609 | 204 | 165 |
| 24 | 221 | 1213 | 793 | 756 | 627 | 205 | 173 |
| 25 | 515 | 897 | 658 | 1254 | 423 | 256 | 227 |
| 26 | 530 | 902 | 676 | 1278 | 443 | 278 | 265 |
| D1 | | 967 | 895 | 1303 | 173 | 397 | 425 |

It can be seen from the combination of Tables 2 and 1 that the oxynitride orange-red fluorescent substance having diffraction peaks in Bragg angle (2θ) ranges of 31.3-32.7 degrees, 35.2-36.2 degrees, 36.2-36.7 degrees, 36.7-37.6 degrees and meeting a condition that the diffraction peak intensity in the range of 36.7-37.6 degrees is not lower than 18% of the diffraction peak intensity in the range of 36.2-36.7 degrees has a higher relative luminous intensity (compare embodiments 2-26 with embodiment 1). When the diffraction peak intensity of the oxynitride orange-red fluorescent substances in a Bragg angle (2θ) range of 36.7-37.6 is not lower than 18% of that of the oxynitride orange-red fluorescent substances in a Bragg angle (2θ) range of 36.2-36.7 degrees, the oxynitride orange-red fluorescent substance having diffraction peaks in Bragg angle (2θ) ranges of 31.3-31.8 degrees, 31.8-32.7 degrees, 35.2-36.2 degrees, 36.2-36.7 degrees, 36.7-37.6 degrees, 48.0-49.5 degrees and 56.0-57.2 degrees (embodiments 3-12 and 15-26) has a higher relative luminous intensity than the oxynitride orange-red fluorescent substance only having diffraction peaks in Bragg angle (2θ) ranges of 31.3-32.7 degrees, 35.2-36.2 degrees, 36.2-36.7 degrees and 36.7-37.6 degrees (embodiments 1, 2, 13 and 14).

The advantages of an LED chip prepared using the fluorescent substance prepared in embodiment 3 are further described below with reference to embodiments 27-30.

Embodiment 27

A blue LED chip is used as a radiation source. Preparing the mixture of the orange-red fluorescent substance of embodiment 3, a yellow fluorescent substance $Y_3Al_5O_{12}$:Ce and a red fluorescent substance $CaAlSiN_3$:Eu for a white LED in a weight ratio of the orange-red:the yellow:the red=15:70:15. Then uniformly disperse them in silicone with a refractive index of 1.41 and a transmissivity of 99%, which comes the raw materials of the light conversion film. Then, the chip is combined with the light conversion film, welded with a circuit and conducted the package, and finally to obtain a white light-emitting device with the chromaticity coordinates of (0.3745, 0.3312), the color rendering index of 92, and the correlated color temperature of 3745K.

Embodiment 28

A blue LED chip is used as a radiation source. Preparing the mixture of the orange-red fluorescent substance of embodiment 3, a yellow fluorescent substance $Y_3Al_5O_{12}$:Ce, a red fluorescent substance CaAlSiN$_3$:Eu and a green fluorescent substance (Y,Lu)$_3$(Al,Ca)$_5$O$_{12}$:Ce for a white LED in a weight ratio of the orange-red:the yellow:the red:the green=15:60:15:10. Then uniformly disperse them in silicone with a refractive index of 1.41 and a transmissivity of 99%, which comes the raw materials of the light conversion film. Then, the chip is combined with the light conversion film, welded with a circuit and conducted the package, and finally to obtain a white light-emitting device with the chromaticity coordinates of (0.3875, 0.3408), the color rendering index of 96, and the correlated color temperature of 3469K.

Embodiment 29

An ultraviolet LED chip (360 nm) is used as a radiation source. The red fluorescent substance of embodiment 14, a blue fluorescent substance Sr$_5$(PO$_4$)$_3$Cl:Eu and a green fluorescent substance Zn$_2$SiO$_4$:Mn are uniformly dispersed in plastic in a weight ratio of the red:the blue:the green=15:60:25 to prepare a plastic film. Then the plastic film is combined with the ultraviolet LED chip, welded with a circuit and conducted the package to obtain a white light-emitting device with the chromaticity coordinates of (0.3876, 0.3439), the color rendering index of 93, and the correlated color temperature of 3461K.

Embodiment 30

A nearly purple LED chip (380 nm) is used as a radiation source. The red fluorescent substance of embodiment 15, a blue fluorescent substance BaMgAl$_{10}$O$_{17}$:Eu and a green fluorescent substance (Y,Lu)$_3$(Al,Ca)$_5$O$_{12}$:Ce are uniformly dispersed in glass in a weight ratio of the red:the blue:the green=15:55:30. Then the chip is combined with the glass, welded with a circuit and conducted the package to obtain a white light-emitting device with the chromaticity coordinates of (0.3876, 0.3412), the color rendering index of 94.4, and the correlated color temperature of 3469K.

It can be known from the foregoing embodiments 27-30 that the oxynitride orange-red fluorescent substance prepared herein can emit white light when used matching with other fluorescent substances and that the white LED produced using the oxynitride orange-red fluorescent substance prepared herein can meet the market demands on high color rendering performance and low color temperature.

The mentioned above is merely preferred embodiments of the present disclosure but is not to be construed as limitation to the protection scope of the present disclosure, and a variety of variations and modifications can be devised by those skilled in the art. Any modification, substitute and improvement made without departing from the spirit and scope of the present disclosure should all fall within the protection scope of the present disclosure.

The invention claimed is:

1. An oxynitride orange-red fluorescent substance, wherein a chemical formula of the fluorescent substance is M$_m$A$_a$Si$_x$N$_y$O$_z$:dR, wherein the element M is one or more of the elements selected from Ca,Sr and Ba, the element A is Al or a mixture of Al with one or more of the elements selected from Ga, La, Sc and Y, the element R is one or more of the elements selected from Ce, Eu and Mn, and chemical formula meets $0.8 \leq m \leq 1.2$, $1 < a < 1.7$, $1 < x < 1.7$, $3 < y < 4.2$, $0 < z < 0.7$, and $0.001 \leq d \leq 0.2$, wherein in a powder X-ray diffraction spectrum of the oxynitride orange-red fluorescent substance in which CuKa rays are used, a main generation phase of the oxynitride orange-red fluorescent substance at least has a diffraction peak in Bragg angle (2θ) ranges of 31.3-32.7 degrees, 35.2-36.2 degrees, 36.2-36.7 degrees and 36.7-37.6 degrees, and wherein an intensity of the diffraction peak in the range of 36.7-37.6 degrees is not lower than 18% of the intensity of the diffraction peak in the range of 36.2-36.7 degrees, and a full width at half maximum of emission spectrum of the fluorescent substance is not below 82 nm.

2. The oxynitride orange-red fluorescent substance according to claim 1, wherein in the chemical formula of the fluorescent substance, a:x=0.8-1.2.

3. The oxynitride orange-red fluorescent substance according to claim 1, wherein in the chemical formula of the fluorescent substance, a/(m+d)>1.

4. The oxynitride orange-red fluorescent substance according to claim 3, wherein in the powder X-ray diffraction spectrum of the oxynitride orange-red fluorescent substance in which CuKa rays are used, the main generation phase of the oxynitride orange-red fluorescent substance at least has a diffraction peak in Bragg angle (2θ) ranges of 31.3-31.8 degrees, 31.8-32.7 degrees, 35.2-36.2 degrees, 36.2-36.7 degrees, 36.7-37.6 degrees, 48.0-49.5 degrees and 56.0-57.2 degrees, and a peak width at half height of emission spectrum of the fluorescent substance is not below 95 nm.

5. The oxynitride orange-red fluorescent substance according to claim 1, wherein the element M is one or more of elements selected from Ca or Sr, the element A is Al or the mixture of Al with one or more of elements selected from Ga or Y, and the element R is one or more of the elements Eu and Mn.

6. The oxynitride orange-red fluorescent substance according to claim 5, wherein the element A is Al.

7. The oxynitride orange-red fluorescent substance according to claim 6, wherein the element R is Eu.

8. The oxynitride orange-red fluorescent substance according to claim 7, wherein the element M is Ca.

9. The oxynitride orange-red fluorescent substance according to claim 1, wherein the fluorescent substance is powder-shaped, film-shaped or sheet-shaped.

10. A light-emitting film or sheet comprising the oxynitride orange-red fluorescent substance of claim 1, wherein the light-emitting film or sheet is formed by at least one of:
(i) dispersing the oxynitride orange-red fluorescent substance in a glass material, a plastic material or a resin material, (ii) dispersing the oxynitride orange-red fluorescent substance and other fluorescent substances in a glass material, a plastic material or a resin material, or (iii) coating the oxynitride orange-red fluorescent substance and other fluorescent substances on a glass material, a plastic material or a resin material.

11. The light-emitting film or sheet according to claim 10, wherein the other fluorescent substances refer to one or more of the following fluorescent substances: (Y,Gd,Lu,Tb)$_3$(Al,Ga)$_5$O$_{12}$:Ce, (Mg,Ca,Sr,Ba)$_2$SiO$_4$:Eu, (Ca,Sr)$_3$SiO$_5$:Eu, (La,Ca)$_3$Si$_6$N$_{11}$:Ce, a-SiAlON:Eu, β-SiAlON:Eu, Ba$_3$Si$_6$O$_{12}$N$_2$:Eu, Ca$_3$(Sc,Mg)$_2$Si$_3$O$_{12}$:Ce, CaSc$_2$O$_4$:Eu, BaAl$_8$O$_{13}$:Eu, (Ca,Sr,Ba)Al$_2$O$_4$:Eu, (Sr,Ca,Ba)(Al,Ga,In)$_2$S$_4$:Eu, (Ca,Sr)$_8$(Mg,Zn)(SiO$_4$)$_4$Cl$_2$:Eu/Mn, (Ca,Sr,Ba)$_3$MgSi$_2$O$_8$:Eu/Mn, (Ca,Sr,Ba)$_2$(Mg,Zn)Si$_2$O$_7$:Eu, Zn$_2$SiO$_4$:Mn, (Y,Gd)BO$_3$:Tb, ZnS:Cu, Cl/Al, ZnS:Ag, Cl/Al, (Sr,Ca)$_2$Si$_5$N$_8$:Eu, (Sr,Ca)AlSiN$_3$:Eu, (Li,Na,K)$_3$Zr$_F$:Mn, (Li,Na,K)$_2$(Ti,Zr)F$_6$:Mn, (Ca,Sr,Ba)(Ti,Zr)F$_6$:Mn, Ba$_{0.65}$Zr$_{0.35}$F$_{2.7}$:Mn, (Sr,Ca)S:Eu, (Y,Gd)BO$_3$:Eu, (Y,Gd)(V,P)O$_4$:Eu, Y$_2$O$_3$:Eu, (Sr,Ca,Ba,Mg)$_5$(PO$_4$)$_3$Cl:Eu, (Ca,Sr,Ba)MgAl$_{10}$O$_7$:Eu, (Ca,Sr,Ba)Si$_2$O$_2$N$_2$:Eu and 3.5MgO.0.5MgF$_2$.GeO$_2$:Mn.

12. A light-emitting device at least comprising a radiation source and the oxynitride orange-red fluorescent substance of claim 1.

13. The light-emitting device according to claim 12, wherein the radiation source is an ultraviolet light emitting source, a purple light emitting source or a blue light emitting source.

14. The light-emitting device according to claim 13, wherein the light-emitting device further comprising: other fluorescent substances which emit light under the excitation of the radiation source.

15. The light-emitting device according to claim 14, wherein the other fluorescent substances refer to one or more of the following fluorescent substances: $(Y,Gd,Lu,Tb)_3(Al,Ga)_5O_{12}$:Ce, $(Mg,Ca,Sr,Ba)_2SiO_4$:Eu, $(Ca,Sr)_3SiO_5$:Eu, $(La,Ca)_3Si_6N_{11}$:Ce, a-SiAlON:Eu, β-SiAlON:Eu, $Ba_3Si_6O_{12}N_2$:Eu, $Ca_3(Sc, Mg)_2Si_3O_{12}$:Ce, $CaSc_2O_4$:Eu, $BaAl_8O_{13}$:Eu, $(Ca,Sr,Ba)Al_2O_4$:Eu, $(Sr,Ca,Ba)(Al,Ga,In)_2S_4$:Eu, $(Ca,Sr)_8(Mg,Zn)(SiO_4)_4Cl_2$:Eu/Mn, $(Ca,Sr,Ba)_3MgSi_2O_8$:Eu/Mn, $(Ca,Sr,Ba)_2(Mg,Zn)Si_2O_7$:Eu, $Zn_2SiO_4$:Mn, $(Y,Gd)BO_3$:Tb, ZnS:Cu, Cl/Al, ZnS:Ag, Cl/Al, $(Sr,Ca)_2Si_5N_8$:Eu, $(Sr,Ca)AlSiN_3$:Eu, $(Li,Na,K)_3ZrF_7$:Mn, $(Li,Na,K)_2(Ti,Zr)F_6$:Mn, $(Ca,Sr,Ba)(Ti,Zr)F_6$:Mn, $Ba_{0.65}Zr_{0.35}F_{2.7}$:Mn, (Sr,Ca)S:Eu, $(Y,Gd)BO_3$:Eu, $(Y,Gd)(V,P)O_4$:Eu, $Y_2O_3$:Eu, $(Sr,Ca,Ba,Mg)_5(PO_4)_3Cl$:Eu, $(Ca,Sr,Ba)MgAl_{10}O_{17}$:Eu, $(Ca,Sr,Ba)Si_2O_2N_2$:Eu and $3.5MgO.0.5MgF_2.GeO_2$:Mn.

16. The oxynitride orange-red fluorescent substance according to claim 2, wherein in the chemical formula of the fluorescent substance, $a/(m+d)>1$.

* * * * *

UNITED STATES PATENT AND TRADEMARK OFFICE
CERTIFICATE OF CORRECTION

PATENT NO. : 9,671,086 B2
APPLICATION NO. : 14/443053
DATED : June 6, 2017
INVENTOR(S) : Ronghui Liu It is certified that error appears in the above-identified patent and that said Letters Patent is hereby corrected as shown below:

In the Specification

In Column 1 at Line 22, Change "thee" to --the--.

In Column 2 at Line 21, Change "$0.85 \leq m \leq 51.2$," to --$0.8 \leq m \leq 1.2$,--.

In Column 4 at Line 12, Before "$m \leq 1.2$," insert --$0.8 \leq$--.

In Column 5 at Line 41, Change "$MgSi_2O$:Eu/Mn," to --$MgSi_2O_8$:Eu/Mn,--.

In Column 6 at Line 24, Change "nitrogenhydrogen" to --nitrogen-hydrogen--.

In Column 7 at Line 16, Change "nitrogenhydrogen" to --nitrogen-hydrogen--.

In Column 11 at Line 20, Change "bluethe" to --blue:the--.

Signed and Sealed this
Tenth Day of October, 2017

Joseph Matal
*Performing the Functions and Duties of the
Under Secretary of Commerce for Intellectual Property and
Director of the United States Patent and Trademark Office*